United States Patent Office 3,551,311
Patented Dec. 29, 1970

3,551,311
RADIATION-CURABLE COMPOSITIONS

Gerald I. Nass, West New York, N.J., Robert W. Bassemir, Jamaica, N.Y., and Daniel J. Carlick, Berkeley Heights, N.J., assignors to Sun Chemical Corporation, New York, N.Y., a corporation of Delaware No Drawing. Filed Nov. 24, 1967, Ser. No. 685,259
Int. Cl. B01j *1/00;* C08d *1/00;* C08f *1/00*
U.S. Cl. 204—159.18 33 Claims

ABSTRACT OF THE DISCLOSURE

Ethylenically unsaturated esters of pentaerythritol, dipentaerythritol, and polypentaerythritols with a halogenated hydrocarbon initiator result in improved energy curing compositions.

This invention relates to energy curing compositions, elements, and process of energy-curing compositions. More particularly, this invention relates to compositions containing an energy-polymerizable polyfunctional ethylenically unsaturated compound exhibiting improved drying speeds.

In the past, it has been known to prepare compositions used as coating materials and the like which consisted essentially of photopolymerizable ethylenically unsaturated monomeric materials. It is also known that such monomeric materials when exposed to actinic energy are converted to polymers. Such monomeric materials when containing certain photoinitiators will polymerize at a vastly improved rate when exposed to suitable actinic energy.

The compositions of the present invention are converted to polymers by exposure to radiation, such as ultraviolet light, electron beam, or gamma radiation. As hereinafter used, the term "photopolymerizable" includes compositions which may have induced polymerization by radiation.

In one embodiment of the present invention, the photopolymerizable compound may be modified by inclusion of a compatible unsaturated compound to improve the mechanical properties important to its use. In another embodiment, a compatible compound which is coreactive with the photopolymerizable compound in the presence of oxygen may be introduced. The coreactive compound may be monomeric or polymeric in nature, may link up with the photopolymerizable compound, and otherwise modify various properties thereof. In still another embodiment of the present invention, a chain transfer agent, e.g., a material capable of chain propagation, may be added. Mixtures of the above component are also within the teachings of the present invention and, where necessary, polymer stabilizers may be added.

The photopolymerizable compounds usable in the present invention are any suitable monomer or prepolymer, i.e., dimer, trimer, or other oligomer, or mixture or copolymer thereof. Particularly useful are free radical polymerizable polyethyleneically unsaturated compounds generally described as the ethylenically unsaturated esters of aliphatic polyhydric alcohols with acrylic acid, methacrylic acid, itaconic acid, and the like, and their mixtures. Specific examples are the esters of pentaerythritol, dipentaerythritol, polypentaerythritols, and so forth, with at least two mols of the acid; examples include, but are not limited to, pentaerythritol diacrylate; pentaerythritol triacrylate; dipentaerythritol triacrylate; pentaerythritol tetraacrylate; dipentaerythritol diacrylate; dipentaerythritol tetraacrylate; dipentaerythritol pentaacrylate; dipentaerythritol hexacrylate; tripentaerythritol octoacrylate; pentaerythritol dimethacrylate; pentaerythritol trimethacrylate; dipentaerythritol dimethacrylate; dipentaerythritol tetramethacrylate; tripentaerythritol octomethacrylate; pentaerythritol diitaconate; dipentaerythritol tri-sitaconate; dipentaerythritol pentaitaconate; dipentaerythritol hexaitaconate; mixtures of dimers and trimers of pentaerythritol triacrylate; mixtures of dimers and trimers of tripentaerythritol octoacrylate; mixtures of dimers, trimers, and higher polymers of dipentaerythritol hexacrylate; and the like; as well as mixtures thereof.

The photopolymerizable compounds may be used in amounts ranging between about 20 and 98% by weight of the compound-photoinitiator mixture and preferably from about 30 to 70% by weight of the mixture.

The above-described esters may be obtained by any known and convenient means, for example, by the ester interchange method of interacting an ester of acrylic acid with the polyhydric alcohol in the presence of a suitable catalyst or by the direct reaction of the polyhydric alcohol with acrylic acid or an acrylyl halide.

The sensitizers or photoinitiators of the present invention are characterized by halogenated aliphatic, alicyclic, and aromatic hydrocarbons and their mixtures in which the halogen atoms are attached directly to the ring structure in the aromatic and alicyclic compounds; that is, the halogen is bonded directly to the aromatic hydrocarbon nucleus; the halogen atoms are attached to the carbon chain in the aliphatic compounds. The halogen may be chlorine, bromine, or iodine. These sensitizers or photoinitiators are used in amounts of about 2 to 80% by weight and preferably from 30 to 70% of the compound-photoinitiator mixture. Suitable photoinitiators include, for example, polychlorinated polyphenyl resins, such as the aroclors (Monsanto Chemical Company) which in general are polychlorinated diphenyls, polychlorinated triphenyls, and mixtures of polychlorinated diphenyls and polychlorinated triphenyls; chlorinated rubbers, such as the Parlons (Hercules Powder Company); copolymers of vinyl chloride and vinyl isobutyl ether, such as Vinoflex MP–400 (BASF Colors and Chemicals, Inc.); chlorinated aliphatic waxes, such as Chlorowax 70 (Diamond Alkali, Inc.); Perchloropentacyclodecane, such as Dechlorane+ (Hooker Chemical Co.); chlorinated paraffins, such as Clorafin 40 (Hooker Chemical Co.) and Unichlor–70B (Neville Chemical Co.); mono- and polychlorobenzenes; mono- and polybromobenzenes; mono- and polychloroxylenes; mono- and polybromoxylenes; dichloromaleic anhydride; 1-chloro-2-methyl naphthalene; 2,4-dimethylbenzene sulfonyl chloride; 1-bromo-3-(m-phenoxy benzene); 2-bromoethyl methyl ether; chlorendic anhydride; and the like; and mixtures thereof.

Factors varying the rate at which a photopolymerizable composition will dry include the specific ingredients in the composition, concentration of the photoinitiators, thickness of the material, nature and intensity of the radiation source and its distance from the material, the presence or absence of oxygen, and the ambient temperature. The compositions of the present invention may be used in relatively thick layers or may be used as thin films having thicknesses of from about 0.5 to 150 microns, and preferably from about 1 to 10 microns.

Any suitable source of radiation may be used, such as, for example, a 100-watt Hanovia high pressure mercury arc quartz ultraviolet lamp; a 1200-watt Hanovia 12" long ultraviolet lamp; a 300,000-volt linear electron accelerator; or a gamma radiation emitter, such as cobalt-60. Distances of the radiation source from the work may range from about ⅛" to 10", and preferably from about ⅛" to 3".

In another embodiment of the present invention, the photopolymerizable compound is modified by inclusion of a compatible compound which is coreactive with it in the presence of oxygen. A viscosity control agent, for example, may be introduced into the system and add plasticizing properties thereto.

Some coreactive substances which may be added to the photopolymerizable compound include unsaturated polyester resins, epoxy resins, aryl sulfonamide-formaldehyde resins, urea formaldehyde resins, and cetyl vinyl ether. These substances react with the monomer or prepolymer and improve various properties of the composition. The polyester resins, for example, improve the adhesive, plasticizing, and rheological properties of the composition. The epoxy resins, i.e., synthetic resins possessing terminal epoxide groups, e.g., a lower molecular weight prepolymer produced by condensation of epichlorhydrin with bisphenol A, produce excellent bonding and result in flexible films which are especially suitable for lamination purposes. The urea formaldehyde resins work particularly well in supplementary heat catalyst systems wherein the temperature of the surrounding atmosphere is raised to about 150° F. or higher. The cetyl vinyl ether lends plasticizing properties to the photopolymerizable composition. These resins and monomers may be utilized in amounts between about 10 and 50% of the total composition.

Prepolymers such as diallyl phthalate prepolymers may be added to the photopolymerizable monomer or prepolymer to react therewith in the presence of oxygen. The prepolymers may be used in amounts of from about 10 to 50% by weight of the total composition and result in tough, more flexible surface cured films.

The above-described photopolymerizable compound may also be improved by inclusion of from about 0.1 to 2.0% of a chain transfer agent by weight of the total composition. Suitable compounds include the mercaptans and their derivatives, e.g., glycol mercaptoacetate and ethyl mercaptoacetate; tertiary aliphatic amines, e.g., triethanolamine and t-butyl-diethanolamine; morpholine; n-amino morpholine; n-amino ethylmorpholine; n-amino propylmorpholine; amine oxides, such as bis(2-hydroxyethyl) cocoamine oxide and bis(2-hydroxyethyl) octadecylamine oxide; cyclicized unsaturated aromatic hydrocarbons, e.g., neohexene, cyclohexane, cyclooctene, and d-limonene; and the like; and their mixtures. Typical cure times with use of compositions including chain transfer agents have been less than one-half second when a film of from about 1 to 10 microns is exposed to actinic energy under the above conditions. Polymerization of compositions including chain transfer agents during storage of extended periods may be retarded by inclusion of from about 0.1 to 5% of a stabilizer which is compatible with the photopolymerizable compositions and does not significantly affect the polymerization rate thereof when exposed to ultraviolet light. Such a stabilizer is typified by diethylhydroxylamine.

The above-described additives to the photopolymerizable monomer or prepolymer may further be used in varying mixtures. At will be seen more particularly in the following examples, the photopolymerizable compound-photoinitiator mixture of the present invention may be modified by addition of a prepolymer and a chain transfer agent; a viscosity control agent and a chain transfer agent, a prepolymer, or other modifying resin; and mixtures thereof.

The photopolymerizable compositions of the present invention are suitable as adhesives, particularly in the laminating art; as coatings for metals, plastics, textiles, paper, cardboard, glass, boxboard, and the like; as markers for roads, parking lots, airfields, and similar surfaces; as vehicles for printing inks, lacquers, and paints; and in the preparation of a photopolymerizable layer of a composition as described herein. Moreover, various dyestuffs, pigments, plasticizers, lubricants, and other modifiers may be incorporated to obtain certain desired characteristics in the finished products.

When the photopolymerizable compositions of the present invention are used as adhesives with substrates, at least one of the substrates must be translucent when ultraviolet light is used. When the radiation source is an electron beam or gamma radiation, at least one of the substrates must be capable of transmitting high energy electrons or gamma radiation, respectively, and neither is necessarily translucent to light. Typical laminations include polymer-coated cellophane to polymer-coated cellophane films, polymer-coated cellophane to polypropylene, Mylar to a metal substrate such as copper, opaque oriented polypropylene to aluminum, and the like. Particularly suitable compositions for use in lamination include mixtures of a photopolymerizable monomer or prepolymer with an aryl sulfonamide-formaldehyde resin. The latter system gives a highly suitable, flexible plasticized film giving a tear seal for coated cellophane to coated cellophane and coated cellophane to treated polypropylene laminations and near tear seals for treated polyethylene to treated polyethylene laminations.

The photopolymerizable compositions of the present invention may be utilized for metal coatings and particularly for metals which are to be subsequently printed. Glass and plastics may also be coated, and the coatings are conventionally applied by roller or spray. Pigmented coating systems may be used for various polyester and vinyl films; glass; polymer-coated cellophane; treated and untreated polyethylene, for example in the form of disposable cups or bottles; and the like. Examples of metals which may be coated include sized and unsized tin plate.

When used as vehicles for inks, e.g., printing inks, the composition may be pigmented with many organic or inorganic pigments, e.g., molybdate orange, titanium white, chrome yellow, phthalocyanine blue, and carbon black, as well as colored with dyes. Stock which may be printed includes paper, clay-coated paper, and boxboard. In addition, the compositions of the present invention are suitable for the treatment of textiles, both natural and synthetic, e.g., in vehicles for textile printing inks or for specialized treatments of fabrics to produce water repellency, oil and stain resistance, crease resistance, etc.

Photopolymerizable elements of this invention comprise a support, e.g., a sheet or plate, having superimposed thereon a layer of the above-described photopolymerizable compositions. Suitable base or support materials include metals, e.g., steel and aluminum plates, sheets, and foils, and films or plates composed of various film-forming synthetic resins or high polymers, such as addition polymers, and in particular vinyl polymers, e.g., vinyl chloride polymers; vinylidene chloride polymers; vinylidene chloride copolymers with vinyl chloride, vinyl acetate, or acrylonitrile; and vinyl chloride copolymers with vinyl acetate or acrylonitrile; linear condensation polymers such as polyesters, c.g., polyethylene terephthalate; polyamides; etc. Fillers or reinforcing agents can be present in the synthetic resin or polymer bases. In addition, highly reflective bases may be treated to absorb ultraviolet light, or a light absorbtive layer can be transposed between the base and photopolymerizable layer.

Photopolymerizable elements can be made by exposing to ultraviolet light selected portions of the photopolymerizable layer thereof until addition polymerization is completed to the desired depth in the exposed portions. The unexposed portions of the layer are then removed, e.g., by use of solvents which dissolve the monomer or prepolymer but not the polymer.

The invention and its advantages will be better understood with reference to the following illustrative examples, but it is not intended to be limited thereto. In the examples, the parts are given by weight unless other specified. Unless otherwise indicated in the following examples, when the ingredient is solid at room temperature, the mixture may be heated to melt the solid ingredient, but generally not above 100° C. The atmospheric and temperature conditions were ambient unless otherwise noted and the compositions were exposed at varying distances between ½ and 10 inches from a high pressure mercury arc quartz ultraviolet lamp, such as manufactured by Hanovia, in film thicknesses between 1 micron and 10 mils.

EXAMPLES 1–9

A comparison of the rates of drying while exposed to atmospheric oxygen was made of pentaerythritol triacrylate (PTETA), trimethylolpropane triacrylate (TMPTA), and mixtures of the two in the presence of a photoinitiator-modifier mixture of 2 parts of Aroclor 1260, Monsanto Chemical Co.'s biphenyl containing 60 weight percent of chlorine, and 1 part Monsanto Chemical Co.'s Santolite MHP (a-toluene sulfonamide formaldehyde resin). Each of the compositions set forth below was tested by exposing a thin film thereof on a glass slide at a distance of ten inches from a 1200-watt Hanovia lamp and the times required to produce a tack-free film are shown below.

| Example No. | Composition in parts by weight | | | | Drying time in second |
|---|---|---|---|---|---|
| | TMPTA | PTETA | Aroclor 1260 | Santolite MHP | |
| 1 | 25 | | 50 | 25 | 7.0 |
| 2 | 12.5 | 12.5 | 50 | 25 | 6.5 |
| 3 | | 25 | 50 | 25 | 5.0 |
| 4 | 50 | | 33.34 | 16.66 | 12.0 |
| 5 | 25 | 25 | 33.34 | 16.66 | 4.5 |
| 6 | | 50 | 33.34 | 16.66 | 3.5 |
| 7 | | 75 | 16.67 | 8.33 | 2.5 |
| 8 | | 87.5 | 8.34 | 4.16 | 3.0 |
| 9 | | 100 | | | (1) |

1 Still wet after 60 seconds.

The compositions of Examples 2, 3, 5, 6, 7 and 8 demonstrate the significantly increased drying rate of the photopolymerizable compositions containing pentaerythritol triacrylate.

EXAMPLES 10–16

Photopolymerizable compositions of pentaerythritol triacrylate (PTETA) and Aroclor 1260 were tested to compare the drying rate with and without a film modifier (Santolite MHP) and also to determine what effect a chain transfer agent [triethanolamine (TEA)] had on the drying rate. The compositions set forth below are in parts by weight and the drying time, in seconds, was determined in the same manner as that used in Examples 1–9.

| Example No. | Compositions | | | | Drying time in seconds |
|---|---|---|---|---|---|
| | PTETA[1] | Aroclor 1260 | Santolite MHP | TEA | |
| 10 | 75 | 25 | | | 5 |
| 11 | 50 | 50 | | | 4 |
| 12 | 25 | 75 | | | 10 |
| 13 | 90 | 10 | | | 8 |
| 14 | 10 | 90 | | | 20 |
| 15 | 74 | 16.67 | 8.33 | 1 | 2 |
| 16 | 73 | 16.67 | 8.33 | 2 | 2 |
| 17 | 75 | 16.67 | 8.33 | | 4.5 |

1 Containing dimethyl hydroquinone inhibitor.

EXAMPLES 18–22

Photopolymerizable compositions of dipentaerythritol hexacrylate (DPEHA) and a photoinitiator-modifier mixture of 2 parts by weight of Aroclor 1260 and 1 part by weight of Santolite MHP were prepared by mixing in the parts by weight indicated below to determine the optimum ratio of DPEHA to the photoinitiator and curing time for comparison with pentaerythritol triacrylate (Example 22) using the exposure method of Examples 1–9.

| Example No. | Compositions | | | Drying time in seconds |
|---|---|---|---|---|
| | DPEHA | Aroclor 1260 | Santolite MHP | |
| 18 | 75 | 16.67 | 8.33 | 1.5 |
| 19 | 50 | 33.34 | 16.66 | 2.5 |
| 20 | 25 | 50.00 | 25.00 | 5.0 |
| 21 | 87.5 | 8.34 | 4.16 | 4.0 |
| 22 | [1] 75 | 16.67 | 8.33 | 2.5 |

1 PTETA.

The above examples demonstrate that a composition containing the optimum ratio (Example 18) of dipentaerythritol hexacrylate to the photoinitiator-modifier mixtures cures almost twice as fast as one containing the optimum ratio (Example 22) of pentaerythritol triacrylate to the same photoinitiator-modifier mixture.

EXAMPLES 23–29

Photopolymerizable compositions were prepared by mixing tripentaerythritol octoacrylate (TPEOA) with a photoinitiator-modifier mixture of 2 parts by weight of Aroclor 1260 and 1 part by weight of Santolite MHP. The compositions contained the parts by weight indicated below and drying times were determined by the method of Examples 1–9.

| Example No. | Compositions | | | Drying time in seconds |
|---|---|---|---|---|
| | TPEOA | Aroclor 1260 | Santolite MHP | |
| 23 | 25 | 50 | 25 | >5 |
| 24 | 35 | 43.34 | 21.66 | 4 |
| 25 | 50 | 33.34 | 16.66 | 3 |
| 26 | 60 | 26.67 | 13.33 | 2–3 |
| 27 | 70 | 20.00 | 10.00 | 1 |
| 28 | 75 | 16.67 | 8.33 | 1–2 |
| 29 | 87.5 | 8.34 | 4.16 | 3 |

EXAMPLES 30–36

The composition of Example 27 having exhibited the fastest curing time as determined in Examples 23–29, tests were conducted to determine the effect of other compounds thereon. These compositions are in parts by weight as indicated below with the monomers being tripentaerythritol octoacrylate (TPEOA), trimethylolpropane triacrylate (TMPTA), and pentaerythritol triacrylate (PTETA), and the photoinitiator-modifier mixture of Examples 23–29.

| Example No. | Compositions | | | | | Drying time in seconds |
|---|---|---|---|---|---|---|
| | TPEOA | TMPTA | PTETA | Aroclor 1260 | Santolite MHP | |
| 30 | 70 | | | 20 | 10 | 1.0 |
| 31 | 65 | 5 | | 20 | 10 | 1.0 |
| 32 | 60 | 10 | | 20 | 10 | 1.0 |
| 33 | 35 | 35 | | 20 | 10 | 1.5 |
| 34 | 65 | | 5 | 20 | 10 | 1.5 |
| 35 | 60 | | 10 | 20 | 10 | 1.0 |
| 36 | 35 | | 35 | 20 | 10 | 4.0 |

It was noted that the pentaerythritol monomer without the modifier cured most rapidly in a 50/50 mixture with the photo-initiator as opposed to the 75/25 mixture of Examples 1–9. The inclusion of 1–2% of triethanolamine resulted in doubling the speed of drying without substantially affecting the stability of the compositions.

The inclusion of from 5 to 10% of either trimethylolpropane triacrylate or pentaerythritol triacrylate did not substantially affect the drying time of the tripentaerythritol octoacrylate and reduced the viscosity of the monomer, thereby making the composition more suitable as an ink vehicle-binder.

EXAMPLES 37–48

The procedure of Examples 10–22 were repeated except that instead of being exposed to ultraviolet light the samples were passed on a conveyor belt beneath the beam of a Dynacote 300,000-volt linear electron accelerator at a speed and beam current so regulated as to produce a dose rate of 0.5 megarad.

These systems produced resinous materails of varying degrees of hardness in films from 0.5 to 20 mils thick having tacky surfaces.

EXAMPLE 49

A composition containing 98% of pentaerythritol tetraacrylate and 2% of pentachlorobenzene was dried by the procedure of Examples 1–9. The results were comparable.

EXAMPLE 50

A composition containing 80% of pentaerythritol tetraacrylate, 18% of Aroclor 4465 (a mixture of bi- and triphenyls containing 65% of chlorine by weight), and 2% of polychlorobenzene was dried by the procedure of Examples 1–9. The results were comparable.

EXAMPLE 51

A composition containing 87.5% of tripentaerythritol octoacrylate and 12.5% of 1-bromo-3-(m-phenoxyphenoxy benzene) was dried by the procedure of Examples 1–9. The results were comparable.

EXAMPLE 52

A composition containing 70% of pentaerythritol tetraacrylate and 30% of chlorendic anhydride was dried by the procedure of Examples 1–9. The results were comparable.

EXAMPLE 53

A composition containing 75% of a prepolymer (a mixture of dimers and trimers) of dipentaerythritol hexacrylate and 25% of a 2:1 mixture of Aroclor 1260 and Santolite MHP was dried by the procedure of Examples 1–9. The results were comparable.

EXAMPLE 54

The procedure of Example 53 was repeated except that 2-bromoethyl methyl ether was used instead of Aroclor 1260. The results were comparable.

EXAMPLE 55

The procedure of Examples 15 and 16 were repeated except that each of the following was used as the chain transfer agent instead of triethanolamine: morpholine, n-amino morpholine, cyclohexane, d-limonene, glycol mercaptoacetate, and bis (2-hydroxyethyl) octadecylamide oxide. The results were comparable.

EXAMPLE 56

A thin film of a composition containing 50% of dipentaerythritol hexacrylate, 25% of Santolite MHP, and 25% of Aroclor 1260 was applied to a sheet of aluminum plate and then exposed to a 1200-watt ultraviolet source at a distance of 3 inches. The film was dried in about 1 second.

EXAMPLE 57

The procedure of Example 56 was repeated except that the substrate was cardboard. The film was dried in about 1 second.

EXAMPLE 58

The procedure of Example 56 was repeated except that the substrate was paper. The film dried in about 1 second.

EXAMPLE 59

The procedure of Example 56 was repeated except that the substrate was glass. The film dried in about 1 second.

EXAMPLE 60

A laminate was made of a film of polymer-coated cellophane and a film of oriented polypropylene with the composition of Example 53 between the two. The laminate was exposed to ultraviolet light as in Examples 1–9, and a tight bond was effected in ¼ second.

EXAMPLE 61

A laminate was made of a sheet of copper and a film of Mylar with the composition of Example 49 between the two. The laminate was exposed to electron beam radiation as in Examples 37–48. The results were comparable.

EXAMPLE 62

A red ink was prepared from 67% of a prepolymer (a mixture of dimers and trimers) of pentaerythritol triacrylate, 9.75% of Aroclor 1260, 3.25% of Santolite MHP, and 20% of Lithol Rubine red pigment. A glass bottle printed with this ink was exposed to a 1200-watt ultraviolet lamp at a distance of 1 inch. The ink dried in less than 1 second. It had excellent adhesion to the glass and good grease- and rub-resistance.

EXAMPLES 63–69

The compositions of Examples 49–55 were dried by the procedure of Examples 37–48. The results were comparable.

What is claimed is:

1. A radiation-curable solvent-free composition consisting essentially of (1) about 20 to 98 percent by weight of at least one ester of an ethylenically unsaturated acid and pentaerythritol, dipentaerythritol, or a polypentaerythritol and (2) about 2 to 80 percent by weight of at least one halogenated aromatic, alicyclic, or aliphatic hydrocarbon photoinitiator wherein all of the halogen atoms are attached directly to the ring in the aromatic and alicyclic compounds and to the carbon chain in the aliphatic compounds.

2. The composition of claim 1 wherein the ester is pentaerythritol triacrylate.

3. The composition of claim 1 wherein the ester is pentaerythritol tetraacrylate.

4. The composition of claim 1 wherein the photoinitiator is biphenyl containing 60 weight percent of chlorine.

5. The composition of claim 1 wherein the photoinitiator is a mixture of biphenyls and triphenyls containing 65 weight percent of chlorine.

6. The composition of claim 1 wherein the photoinitiator is pentachlorobenzene.

7. The composition of claim 1 wherein the photoinitiator is polychlorobenzene.

8. The composition of claim 1 wherein the photoinitiator is 1-bromo-3-(m-phenoxyphenoxy benzene).

9. The composition of claim 1 wherein the photoinitiator is chlorendic anhydride.

10. The composition of claim 1 wherein the photoinitiator is 2-bromoethyl methyl ether.

11. The composition of claim 1 wherein said ester is a monomer.

12. The composition of claim 1 wherein said ester is a prepolymer.

13. The composition of claim 1 wherein said ester is an acrylate.

14. The composition of claim 1 wherein said ester is a methacrylate.

15. The composition of claim 1 wherein said ester is an itaconate.

16. The composition of claim 1 wherein said hydrocarbon is aliphatic.

17. The composition of claim 1 wherein said hydrocarbon is aromatic.

18. The composition of claim 1 wherein said hydrocarbon is alicyclic.

19. The composition of claim 1 wherein said halogen is chlorine, bromine, or iodine.

20. The composition of claim 1 wherein from 30% to 70% of said composition is a mixture of dimers and trimers of pentaerythritol triacrylate.

21. The composition of claim 1 wherein from 30% to 70% of said composition is dipentaerythritol hexacrylate.

22. The composition of claim 1 wherein from 30% to 70% of said composition is tripentaerythritol octoacrylate.

23. An article having a dried coating of the composition of claim 1.

24. An article having a dried coating of the composition of claim 11.

25. An article having a dried coating of the composition of claim 12.

26. An article comprising two films adhered by the composition of claim 1.

27. An article comprising two films adhered by the composition of claim 11.

28. An article comprising two films adhered by the composition of claim 12.

29. A photopolymerizable element comprising a support and a coating thereon of the photopolymerizable composition of claim 1.

30. A method of drying which comprises exposing to a source of radiation the composition of claim 1.

31. The method of claim 30 wherein the radiation source is ultraviolet light.

32. The method of claim 30 wherein the radiation source is electron beam radiation.

33. The method of claim 30 wherein the radiation source is gamma radiation.

References Cited

UNITED STATES PATENTS

| | | | |
|---|---|---|---|
| 2,505,067 | 4/1950 | Sachs et al. | 204—159.23 |
| 3,046,127 | 7/1962 | Barney et al. | 96—35 |
| 3,203,802 | 8/1965 | Burg | 204—159.23 |
| 3,368,900 | 2/1968 | Burg | 204—159.23 |

SAMUEL H. BLECH, Primary Examiner

R. B. TURER, Assistant Examiner

U.S. Cl. X.R.

117—12, 93.31, 124, 132, 135.5, 138.8, 155, 161; 161—218, 249; 204—159.15, 159.23; 260—41, 78.4, 86.1, 89, 836, 837, 851, 872, 885